(12) United States Patent
Zhang et al.

(10) Patent No.: US 12,704,536 B2
(45) Date of Patent: Aug. 11, 2026

(54) METHOD AND SYSTEM FOR ALIGNING TEST ENVIRONMENTS

(71) Applicant: MediaTek Singapore Pte. Ltd., Singapore (SG)

(72) Inventors: Shuang Zhang, Beijing (CN); Jianfei Xiao, Beijing (CN); Yan Wu, Beijing (CN); Lingfei Fan, Beijing (CN); Deqiang Li, Beijing (CN); Xinqiu Wang, Beijing (CN); Jianwei Zhang, Beijing (CN)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 351 days.

(21) Appl. No.: 17/932,018

(22) Filed: Sep. 14, 2022

(65) Prior Publication Data

US 2023/0093058 A1 Mar. 23, 2023

(30) Foreign Application Priority Data

Sep. 17, 2021 (CN) ......................... 202111096210.1
Aug. 26, 2022 (CN) ......................... 202211031107.3

(51) Int. Cl.
*G01R 29/08* (2006.01)
*H04W 24/06* (2009.01)
*H04W 24/10* (2009.01)

(52) U.S. Cl.
CPC ........ *G01R 29/0821* (2013.01); *H04W 24/06* (2013.01); *H04W 24/10* (2013.01)

(58) Field of Classification Search
CPC .............. G01R 29/0821; G01R 29/105; G01R 29/0871; G01R 31/2822; H04W 24/06; H04W 24/10; H04B 17/3912
See application file for complete search history.

(56) References Cited

U.S. PATENT DOCUMENTS

2020/0209296 A1 7/2020 Kong et al.
2021/0336707 A1* 10/2021 Chervyakov ...... H04B 17/0085

FOREIGN PATENT DOCUMENTS

CN 101009523 A 8/2007
CN 103198835 A 7/2013
(Continued)

OTHER PUBLICATIONS

Fan, W., Kyosti, P., Ji, Y. and Pedersen, G.F., 2020, March. On Noise and Interference Modeling for Over-the-air Testing of MIMO Terminals. In 2020 14th European Conference on Antennas and Propagation (EuCAP) (pp. 1-5). IEEE.*
(Continued)

*Primary Examiner* — Zhitong Chen
(74) *Attorney, Agent, or Firm* — McClure, Qualey & Rodack, LLP

(57) ABSTRACT

A method for aligning test environments is provided. The method includes: measuring, by a measurement device located in an anechoic chamber, a standard signal transmitted from a base station simulator and went through to a channel emulator, then output with noise added inside the channel emulator, to multiple antennas within the anechoic chamber; obtaining, by a computing device, measurement information based on the standard signal and the noise transmitted from the measurement device; determining, by the computing device, whether the measurement information is within a predetermined range of a target value; and transmitting, by the computing device, a control signal to the channel emulator to adjust the noise output from the channel emulator so that the computing device obtains desired measurement information based on the standard signal and the adjusted noise when the measurement information is not within the predetermined range of the target value.

12 Claims, 4 Drawing Sheets

(56) References Cited

FOREIGN PATENT DOCUMENTS

| | | | |
|---|---|---|---|
| CN | 104917577 | A | 9/2015 |
| CN | 210780823 | U | 6/2020 |
| WO | 2011088689 | A1 | 7/2011 |
| WO | 2020/033643 | A1 | 2/2020 |
| WO | 2021/087790 | A1 | 5/2021 |

OTHER PUBLICATIONS

Li, J., Qi, Y. and Fan, J., 2021. Over-the-air measurement for MIMO systems. Frontiers of Information Technology & Electronic Engineering, 22(8), pp. 1046-1058.*
Extended European Search Report dated Feb. 10, 2023, issued in application No. EP 22195915.8.
Fan, W., et al.; "On Noise and Interference Modeling for Over-the-air Testing of MIMO Terminals;" Jul. 2020; pp. 1-5.
Chinese language office action dated Aug. 29, 2023, issued in application No. TW 111135083.
"3rd Generation Partnership Project;" Technical Specification Group Radio Access Network; Nov. 2020; pp. 1-171.
Rumney, M.,et al.; "MIMO over-the-air research, development, and testing;" International Journal of Antennas and Propagation; vol. 2012; Article ID 467695; Sep. 2012; pp. 1-9.

* cited by examiner

METHOD AND SYSTEM FOR ALIGNING TEST ENVIRONMENTS

CROSS REFERENCE TO RELATED APPLICATIONS

This application claims priority from China Patent Application No. 202111096210.1, filed on Sep. 17, 2021, and China Patent Application No 202211031107.3, filed on Aug. 26, 2022, the disclosure of which are incorporated herein in their entirety by reference.

BACKGROUND OF THE APPLICATION

Field of the Application

The present disclosure generally relates to the field of over-the-air (OTA) test technology. More specifically, aspects of the present disclosure relate to a method and system for aligning test environments.

Description of the Related Art

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

For the performance testing and evaluation of multi-input multi-output (MIMO) communication equipment, whether in the development phase or certification stage, the performance testing and evaluation of MIMO communication equipment strongly relies on the channel model. Generally, the over-the-air (OTA) test is used to evaluate the final performance of traditional communication equipment. The OTA test uses an anechoic chamber to establish a free space without reflection in order to evaluate the overall performance of the radio frequency and antenna of the communication equipment.

In the MIMO OTA technology proposed for evaluating multi-antenna devices, the channel model must be realistically reproduced in the laboratory, and the target channel environment is simulated using the OTA test in the laboratory to examine the performance of the overall device.

In the NR MIMO OTA test environments, a channel emulator is used to generate the channel model to obtain a multipath environment similar to the field in the anechoic chamber. Noise added by the channel emulator includes, but is not limited to, a fixed signal-to-noise ratio and a fixed noise power spectral density. Practice has proved that when using channel emulators from different manufacturers, even if the same signal-to-noise ratio is set, inconsistent test results will be obtained. The reason is that the internal software and hardware implementation methods of channel emulators of different manufacturers are different, and the system environment is complex, so it is impossible to guarantee that the signal-to-noise ratio received by the device to be tested in the center of the anechoic chamber is completely consistent. Therefore, how to use an effective method to align the test environments of the anechoic chamber is a technical problem that needs to be solved urgently.

SUMMARY

The following summary is illustrative only and is not intended to be limiting in any way. That is, the following summary is provided to introduce concepts, highlights, benefits and advantages of the novel and non-obvious techniques described herein. Select, not all, implementations are described further in the detailed description below. Thus, the following summary is not intended to identify essential features of the claimed subject matter, nor is it intended for use in determining the scope of the claimed subject matter.

Therefore, the main purpose of the present disclosure is to provide a method and system for aligning different test environments to overcome the above disadvantages.

In an exemplary embodiment, a method for aligning test environments is provided. The method comprises: measuring, by a measurement device located in an anechoic chamber, a standard signal transmitted from a base station simulator and went through to a channel emulator, then output with noise added inside the channel emulator, to multiple antennas within the anechoic chamber; obtaining, by a computing device, measurement information based on the standard signal and the noise transmitted from the measurement device; determining, by the computing device, whether the measurement information is within a predetermined range of a target value; and transmitting, by the computing device, a control signal to the channel emulator to adjust the noise output from the channel emulator so that the computing device obtains desired measurement information based on the standard signal and the adjusted noise when the measurement information is not within the predetermined range of the target value.

In some embodiments, the measurement information comprises at least one or two of the following parameters: a signal-to-noise ratio (SNR), a signal strength and a noise power.

In some embodiments, the signal strength is a received power of a particular reference signal, or a total power of a full bandwidth signal.

In some embodiments, the particular reference signal is a downlink reference signal, a Synchronization Signal and PBCH block (SSB) signal, or a pilot reference signal.

In some embodiments, the predetermined range is plus or minus ten percent (±10%) of the target value.

In some embodiments, the measurement device is a spectrum analyzer or user equipment.

In an exemplary embodiment, a system for aligning test environments is provided. The system comprises a base station simulator, a channel emulator coupled to the base station simulator, multiple antennas within an anechoic chamber, a measurement device and a computing device. The multiple antennas are coupled to the channel emulator. The measurement device is located in the anechoic chamber and measures a standard signal transmitted from the base station simulator and went through to the channel emulator, then output with noise added inside the channel emulator, to multiple antennas within the anechoic chamber. The computing device is coupled to the measurement device and the channel emulator. The computing device obtains measurement information based on the standard signal and the noise transmitted from the measurement device. The computing device determines whether the measurement information is within a predetermined range of a target value. The computing device transmits a control signal to the channel emulator to adjust the noise output from the channel emulator so that the computing device obtains desired measurement information based on the standard signal and the adjusted noise when the measurement information is not within the predetermined range of the target value.

In an exemplary embodiment, a method for aligning test environments is provided. The method is used in a computing device. The method comprises: receiving a standard signal and noise measured by a measurement device located in an anechoic chamber, wherein the standard signal is transmitted from a base station simulator and went through to a channel emulator, then output with the noise added inside the channel emulator, to multiple antennas within the anechoic chamber; obtaining measurement information based on the standard signal and the noise; determining whether the measurement information is within a predetermined range of a target value; and transmitting a control signal to a channel emulator to adjust the noise output from the channel emulator so that the computing device obtains desired measurement information based on the standard signal and the adjusted noise measured by the measurement device when the measurement information is not within the predetermined range of the target value.

BRIEF DESCRIPTION OF DRAWINGS

The application can be more fully understood by reading the subsequent detailed description and examples with references made to the accompanying drawings, wherein.

DETAILED DESCRIPTION

Various aspects of the disclosure are described more fully below with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using number of the aspects set forth herein. In addition, the scope of the disclosure is intended to cover such an apparatus or method which is practiced using another structure, functionality, or structure and functionality in addition to or other than the various aspects of the disclosure set forth herein. It should be understood that any aspect of the disclosure disclosed herein may be embodied by one or more elements of a claim.

The word “exemplary” is used herein to mean “serving as an example, instance, or illustration.” Any aspect described herein as “exemplary” is not necessarily to be construed as preferred or advantageous over other aspects. Furthermore, like numerals refer to like elements throughout the several views, and the articles “a” and “the” includes plural references, unless otherwise specified in the description.

It should be understood that when an element is referred to as being “connected” or “coupled” to another element, it may be directly connected or coupled to the other element or intervening elements may be present. In contrast, when an element is referred to as being “directly connected” or “directly coupled” to another element, there are no intervening elements present. Other words used to describe the relationship between elements should be interpreted in a like fashion. (e.g., “between” versus “directly between”, “adjacent” versus “directly adjacent”, etc.).

Figure 1:
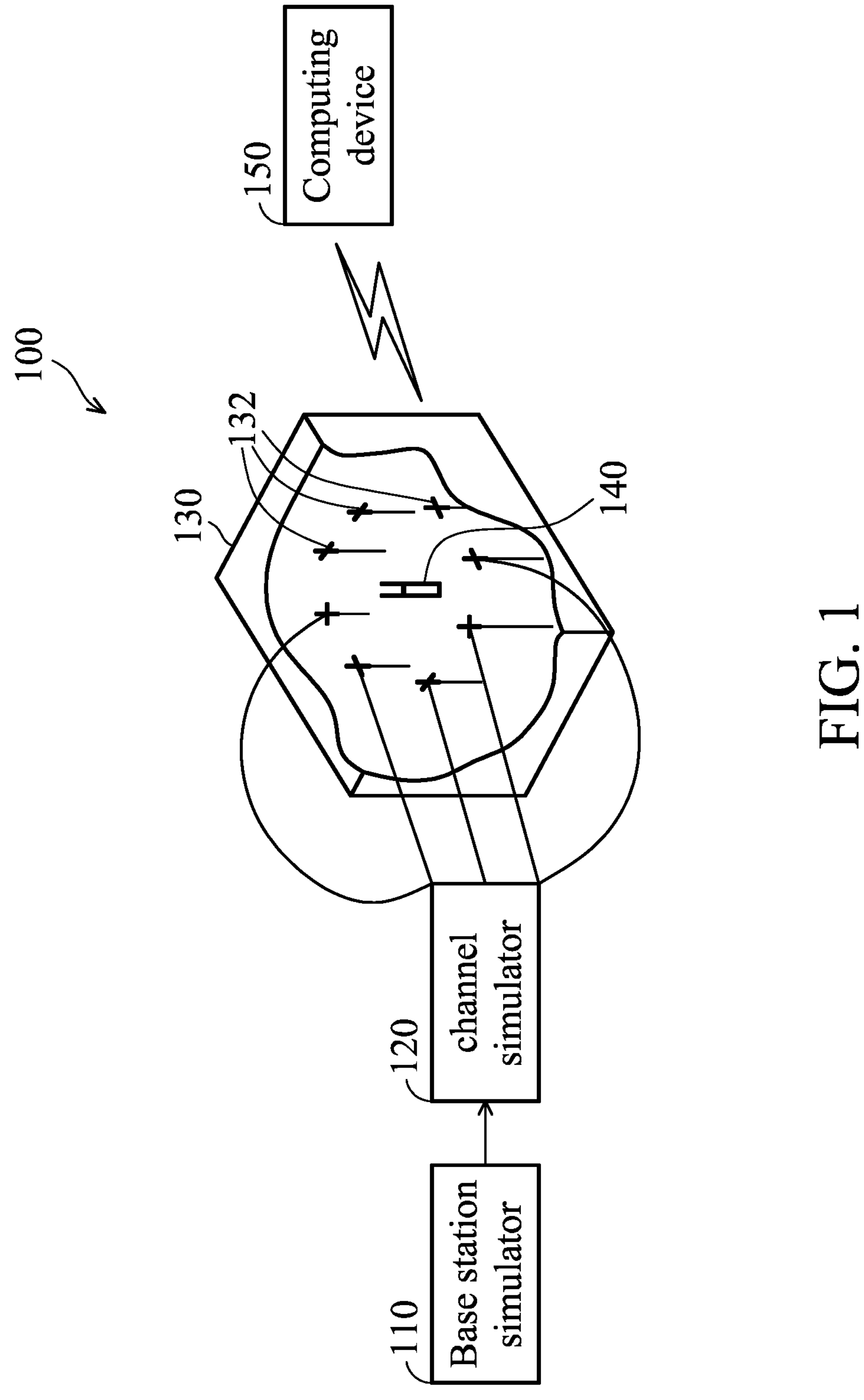
FIG. 1 is a schematic diagram of a system for aligning test environments according to an embodiment of the present disclosure.

FIG. 1 is a schematic diagram of a system 100 for aligning test environments according to an embodiment of the present disclosure, wherein the test environments may be Multiple-Input-Multiple-Output (MIMO) OTA test environments.

As shown in FIG. 1, the MIMO OTA test system 100 comprises a base station simulator 110, a channel emulator 120, an anechoic chamber 130, a measurement device 140 and a computing device 150, wherein the channel emulator 120 is coupled to the base station simulator 110 and multiple antennas 132 within the anechoic chamber 130.

The measurement device 140 has an adaptive antenna system that actively adapts antenna configuration, signal processing or both. In one embodiment, the measurement device is a spectrum analyzer, a dynamometer or user equipment.

The base station simulator 110 may be used to emulate the functions of a base station transceiver in a wireless network.

The channel emulator 120 connected to the base station simulator 110 may be used to help accurately model a real life channel (e.g., by emulating the effects of multipath propagation, variable delays for each path, etc.).

The anechoic chamber 130 may have a cubic structure (six square walls) or a rectangular prism-like structure (six rectangular walls), if desired. There may be multiple antennas such as test antennas 132 that are located on a circumference within the anechoic chamber 130. In a scenario in which the anechoic chamber 130 has a cubic structure with 8 test antennas 132 which takes the measurement device 140 as a circle center. This is merely an example. In general, any number of the test antennas 132 may be used at any location within the anechoic chamber 130. The test antennas 132 may be horn antennas or antennas of other types.

The computing device 150 may receive measurement information from the measurement device 140 and transmit signals to the base station simulator 110 and the channel emulator 120 over a wireless communication, and includes a processor and a memory that may store the program.

The measurement device 140 may measure a standard signal transmitted from the base station simulator 110 and went through the channel emulator 120, then output with noise inside the channel emulator 120, to multiple antennas within the anechoic chamber 130. Then, the computing device 150 obtains measurement information based on the standard signals and the noise transmitted by the measurement device 140, and determines whether the test environments must be aligned according to the measurement information.

The types of computing device 150 range from small handheld devices, such as mobile telephones and handheld computers, to large mainframe systems, such as mainframe computers. Examples of handheld computers include personal digital assistants (PDAs) and notebooks. In another embodiment, the computing device 150 may be used with components, systems, sub-systems, and/or devices other than those that are depicted herein. For example, the computing device 150 can also be integrated with the measurement device 140 as a device located in the anechoic chamber 130.

In addition, although only the base station simulator 110, the channel emulator 120, the anechoic chamber 130, the measurement device 140 and the computing device 150 are shown in FIG. 1, those skilled in the art can understand that other devices, such as amplifiers, signal mapping devices, etc., may be included between the channel emulator 120 and the anechoic chamber 130. Since the other devices are not an implementation focus of the system 100 of the embodiment of the present disclosure, no further description is needed here.

It should be understood that the computing device 150 shown in FIG. 1 is an example of one suitable system 100 architecture for aligning test environments. Each of the components shown in FIG. 1 may be implemented through any type of computing device, such as the computing device 300 described with reference to FIG. 3, for example.

Figure 2:
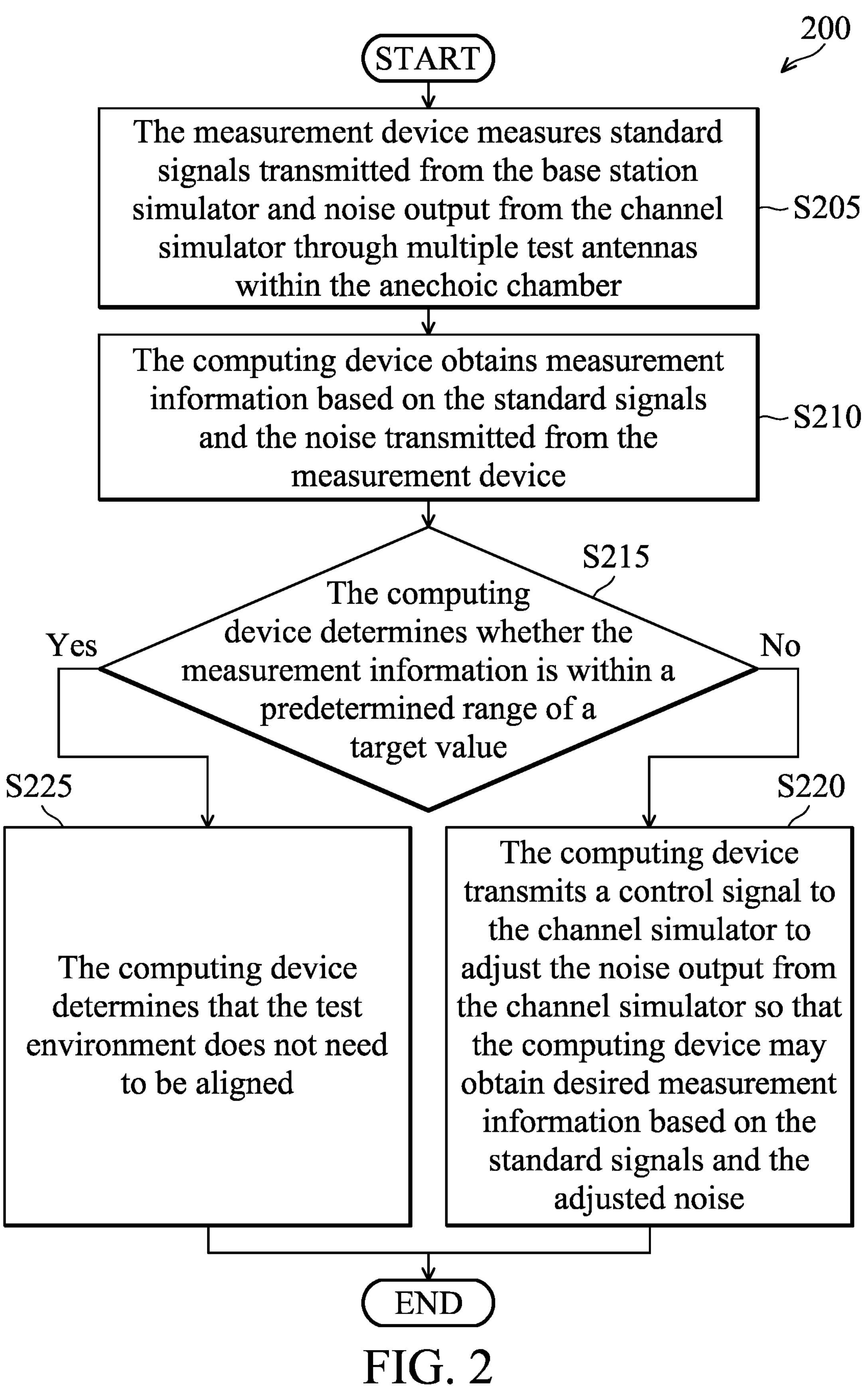
FIG. 2 is a flowchart illustrating the method for aligning test environments according to an embodiment of the disclosure.

FIG. 2 is a flowchart 200 illustrating the method for aligning test environments according to an embodiment of the disclosure, wherein the method is applied to and executed by the measurement device 140 and the computing device 150 of FIG. 1.

In step S205, the measurement device measures a standard signal transmitted from the base station simulator and went through to a channel emulator, then output with noise added inside the channel emulator, to multiple antennas within the anechoic chamber.

Then, in step S210, the computing device obtains measurement information based on the standard signal and the noise transmitted from the measurement device, wherein the measurement information comprises at least one or two the following parameters: of a signal-to-noise ratio (SNR), a signal strength and a noise power.

In one embodiment, the signal strength is a received power of a particular reference signal, or a total power of a full bandwidth signal, wherein the particular reference signal is a downlink reference signal, a Synchronization Signal and PBCH block (SSB) signal, a pilot reference signal, or other reference signal.

Next, in step S215, the computing device determines whether the measurement information is within a predetermined range of a target value, wherein the target value is defined in the test specification. In one embodiment, the predetermined range is plus or minus ten percent (±10%) of the target value.

When the measurement information is not within the predetermined range of the target value ("No" in step S215), in step S220, the computing device transmits a control signal to the channel emulator to adjust the noise output from the channel emulator so that the computing device may obtain desired measurement information based on the standard signal and the adjusted noise.

Back to step S215, when the measurement information is within the predetermined range of the target value ("Yes" in step S215), in step S225, the computing device determines that the test environments do not need to be aligned, and the process is ended.

Figure 3:
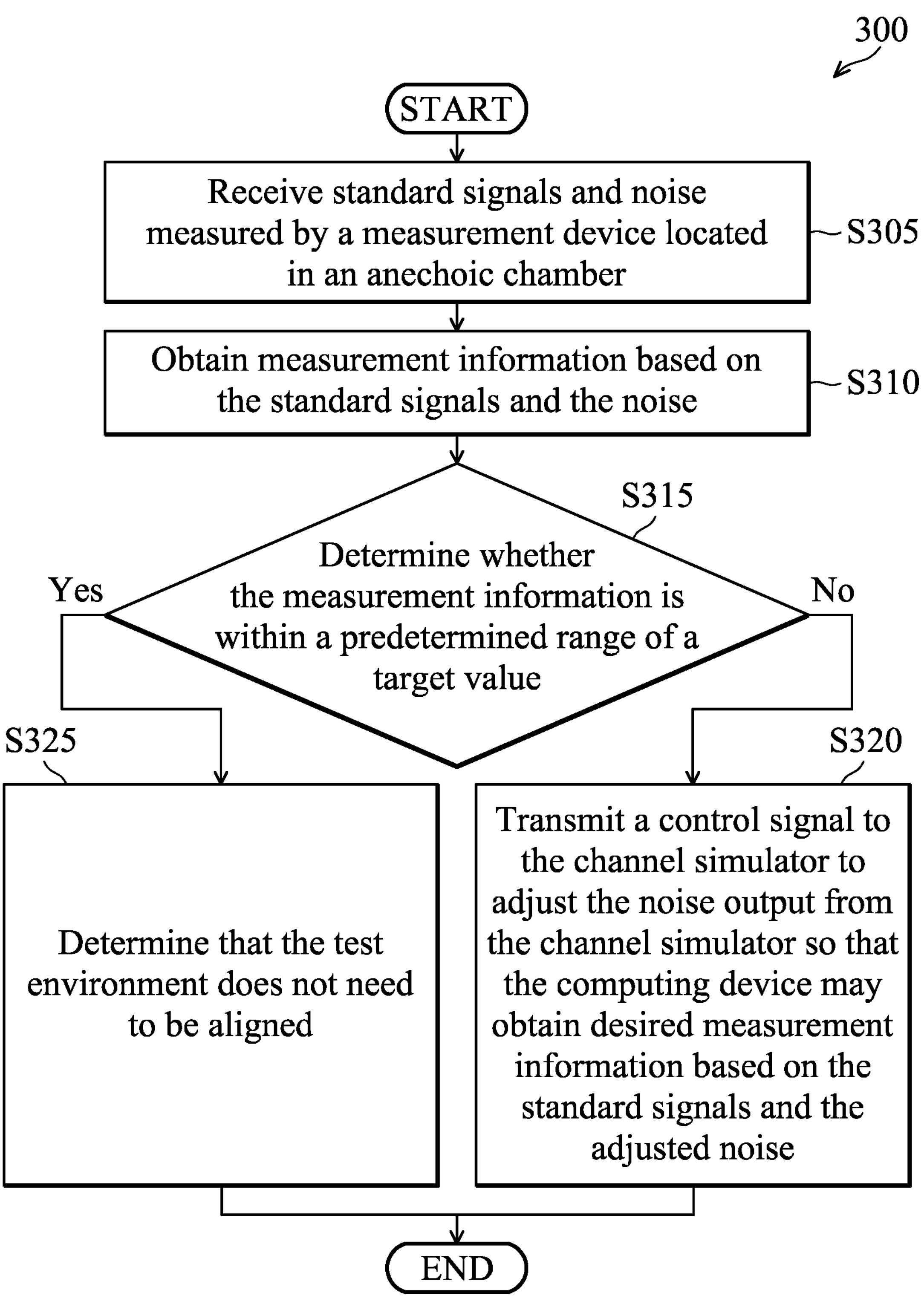
FIG. 3 is a flowchart illustrating the method for aligning test environments according to an embodiment of the disclosure.

FIG. 3 is a flowchart 300 illustrating the method for aligning test environments according to an embodiment of the disclosure, wherein the method is applied to and executed by the computing device 150 of FIG. 1.

In step S305, the computing device receives a standard signal and noise measured by a measurement device located in an anechoic chamber, wherein the standard signal is transmitted from a base station simulator and went through to a channel emulator, then output with the noise added inside the channel emulator, to multiple antennas within the anechoic chamber.

Then, in step S310, the computing device obtains measurement information based on the standard signal and the noise, wherein the measurement information comprises at least one or two of the following parameters: a signal-to-noise ratio (SNR), a signal strength and a noise power.

In one embodiment, the signal strength is a received power of a particular reference signal, or a total power of a full bandwidth signal, wherein the particular reference signal is a downlink reference signal, a Synchronization Signal and PBCH block (SSB) signal, a pilot reference signal, or other reference signal.

Next, in step S315, the computing device determines whether the measurement information is within a predetermined range of a target value, wherein the target value is defined in the test specification. In one embodiment, the predetermined range is plus or minus ten percent (±10%) of the target value.

When the measurement information is not within the predetermined range of the target value ("No" in step S315), in step S320, the computing device transmits a control signal to the channel emulator to adjust the noise output from the channel emulator so that the computing device may obtain desired measurement information based on the standard signal and the adjusted noise.

Back to step S315, when the measurement information is within the predetermined range of the target value ("Yes" in step S315), in step S325, the computing device determines that the test environments do not need to be aligned, and the process is ended.

Multiple implementation embodiments are provided in the present disclosure. The first to third embodiments are cases where the measurement information includes one of the following parameters: a SNR, a signal strength and a noise power. The fourth to sixth embodiments are cases where the measurement information includes two of the following parameters: a SNR, a signal strength and a noise power. The first embodiment will be described first.

First Embodiment

The computing device obtains the parameter configuration X1 of the base station simulator and the channel emulator in advance. Then, the computing device obtains a signal-to-noise ratio (SNR) whose value is A1 based on the standard signal and the noise measured by the measurement device inside the anechoic chamber. The computing device compares A1 with a target value E1, wherein the target value is defined in the test specification. When A1 is not within a predetermined range (for example, ±10%) of the target value E1, the computing device transmits a control signal to the channel emulator to adjust the noise output from the channel emulator so that the computing device may obtain the desired SNR based on the standard signal and the adjusted noise. Specifically, the computing device transmits a control signal to the channel emulator to adjust the configuration of the channel emulator so that the channel emulator may output the desired noise for obtaining the desired SNR. The measurement process is performed repeatedly until A1 meets the requirement (A1 is within the predetermined range of the target value E1). The SNR calibration of the parameter configuration X1 is completed. Similarly, for the different parameter configurations of the base station simulator and the channel emulator, the adjusted parameter configurations can be obtained according to the process.

Second Embodiment

The computing device obtains the parameter configuration X1 of the base station simulator and the channel emulator in advance. Then, the computing device obtains a signal strength whose value is B1 based on the standard signal and the noise measured by the measurement device inside the anechoic chamber. The computing device compares B1 with a target value F1, wherein the target value is defined in the test specification. When B1 is not within a predetermined range (for example, ±10%) of the target value F1, the computing device transmits a control signal to the channel emulator to adjust the noise output from the channel emulator so that the computing device may obtain the desired signal strength based on the standard signal and the adjusted noise. Specifically, the computing device transmits a control signal to the channel emulator to adjust the configuration of the channel emulator so that the channel emulator may output the desired noise for obtaining the desired signal strength. The measurement process is performed repeatedly until B1 meets the requirement (B1 is within the predetermined range of the target value F1). The signal strength calibration of the parameter configuration X1 is completed. Similarly, for the different parameter configurations of the base station simulator and the channel emulator, the adjusted parameter configurations can be obtained according to the process.

Third Embodiment

The computing device obtains the parameter configuration X1 of the base station simulator and the channel emulator in advance. Then, the computing device obtains a noise power whose value is C1 based on the standard signal and the noise measured by the measurement device inside the anechoic chamber. The computing device compares C1 with a target value G1, wherein the target value is defined in the test specification. When C1 is not within a predetermined range (for example, +10%) of the target value G1, the computing device transmits a control signal to the channel emulator to adjust the noise output from the channel emulator so that the computing device may obtain the desired noise power based on the standard signal and the adjusted noise. Specifically, the computing device transmits a control signal to the channel emulator to adjust the configuration of the channel emulator so that the channel emulator may output the desired noise for obtaining the desired noise power. The measurement process is performed repeatedly until C1 meets the requirement (C1 is within the predetermined range of the target value G1). The noise power calibration of the parameter configuration X1 is completed. Similarly, for the different parameter configurations of the base station simulator and the channel emulator, the adjusted parameter configurations can be obtained according to the process.

Fourth Embodiment

The computing device obtains the parameter configuration X1 of the base station simulator and the channel emulator in advance. Then, the computing device obtains a signal-to-noise ratio (SNR) whose value is A1 and a signal strength whose value is B1 based on the standard signal and the noise measured by the measurement device inside the anechoic chamber. The computing device compares A1 and B1 with the respective target values E1 and F1, respectively, wherein the target values are defined in the test specification. When A1 is not within a predetermined range (for example, ±10%) of the target value E1 and B1 is not within a predetermined range (for example, ±10%) of the target value F1, the computing device transmits a control signal to the channel emulator to adjust the noise output from the channel emulator so that the computing device may obtain the desired SNR and signal strength based on the standard signal and the adjusted noise. Specifically, the computing device transmits a control signal to the channel emulator to adjust the configuration of the channel emulator so that the channel emulator may output the desired noise for obtaining the desired SNR and signal strength. The measurement process is performed repeatedly until A1 and B1 meet the requirements (A1 is within the predetermined range of the target value E1, and B1 is within the predetermined range of the target value F1). The SNR and signal strength calibration of the parameter configuration X1 is completed. Similarly, for the different parameter configurations of the base station simulator and the channel emulator, the adjusted parameter configurations can be obtained according to the process.

Fifth Embodiment

The computing device obtains the parameter configuration X1 of the base station simulator and the channel emulator in advance. Then, the computing device obtains a signal-to-noise ratio (SNR) whose value is A1 and a noise power whose value is C1 based on the standard signal and the noise measured by the measurement device inside the anechoic chamber. The computing device compares A1 and C1 with the respective target values E1 and G1, respectively, wherein the target values are defined in the test specification. When A1 is not within a predetermined range (for example, +10%) of the target value E1 and C1 is not within a predetermined range (for example, +10%) of the target value G1, the computing device transmits a control signal to the channel emulator to adjust the noise output from the channel emulator so that the computing device may obtain the desired SNR and noise power based on the standard signal and the adjusted noise. Specifically, the computing device transmits a control signal to the channel emulator to adjust the configuration of the channel emulator so that the channel emulator may output the desired noise for obtaining the desired SNR and noise power. The measurement process is performed repeatedly until A1 and C1 meet the requirements (A1 is within the predetermined range of the target value E1, and C1 is within the predetermined range of the target value G1). The SNR and noise power calibration of the parameter configuration X1 is completed. Similarly, for the different parameter configurations of the base station simulator and the channel emulator, the adjusted parameter configurations can be obtained according to the process.

Sixth Embodiment

The computing device obtains the parameter configuration X1 of the base station simulator and the channel emulator in advance. Then, the computing device obtains a signal strength whose value is B1 and a noise power whose value is C1 based on the standard signal and the noise measured by the measurement device inside the anechoic chamber. The computing device compares B1 and C1 with the respective target values F1 and G1, respectively, wherein the target values are defined in the test specification. When B1 is not within a predetermined range (for example, +10%) of the target value F1 and C1 is not within a predetermined range (for example, +10%) of the target value G1, the computing device transmits a control signal to the channel emulator to adjust the noise output from the channel emulator so that the computing device may obtain the desired signal strength and noise power based on the standard signal and the adjusted noise. Specifically, the computing device transmits a control signal to the channel emulator to adjust the configuration of the channel emulator so that the channel emulator may output the desired noise for obtaining the desired signal strength and noise power. The measurement process is performed repeatedly until B1 and C1 meet the requirements (B1 is within the predetermined range of the target value F1, and C1 is within the predetermined range of the target value G1). The signal strength and noise power calibration of the parameter configuration X1 is completed. Similarly, for the different parameter configurations of the base station simulator and the channel emulator, the adjusted parameter configurations can be obtained according to the process.

It should be noted that although the first to sixth embodiments take the measurement information including one or two of the following parameters: a SNR, a signal strength and a noise power, as an example, those skilled in the art may know that the measurement information may include all of the parameters. The computing device may compare all the three parameters with the corresponding target values to adjust the noise output from the channel emulator.

Therefore, a method and a system for aligning test environments provided in the disclosed embodiments may facilitate the construction of test environments in various different channel emulators and different systems, and obtain consistent results.

Figure 4:
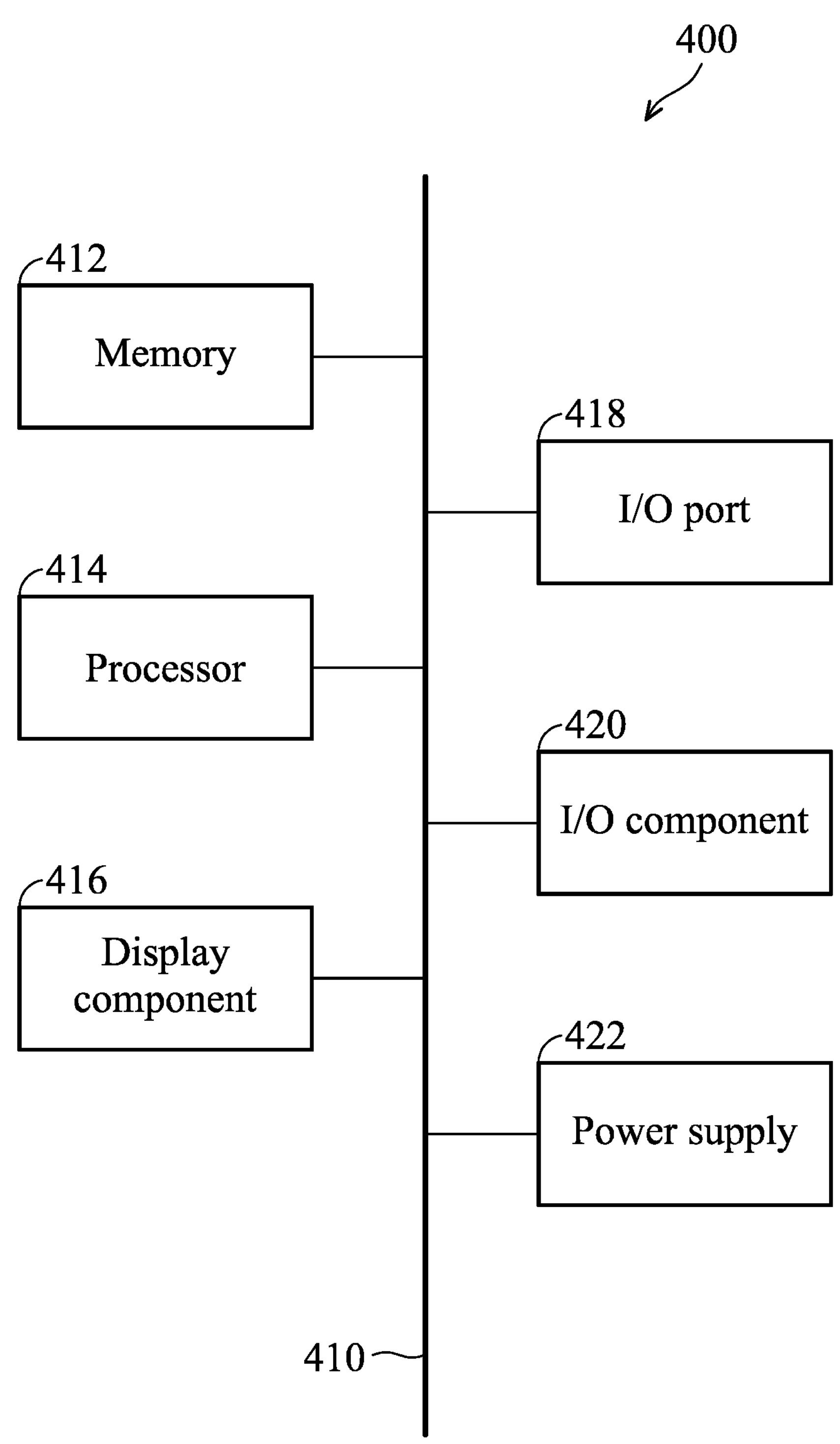
FIG. 4 illustrates an exemplary operating environment for implementing embodiments of the present disclosure.

Having described embodiments of the present disclosure, an exemplary operating environment in which embodiments of the present disclosure may be implemented is described below. Referring to FIG. 4, an exemplary operating environment for implementing embodiments of the present disclosure is shown and generally known as a computing device 400. The computing device 400 is merely an example of a suitable computing environment and is not intended to limit the scope of use or functionality of the disclosure. Neither should the computing device 400 be interpreted as having any dependency or requirement relating to any one or combination of components illustrated.

The disclosure may be realized by means of the computer code or machine-useable instructions, including computer-executable instructions such as program modules, being executed by a computer or other machine, such as a personal data assistant (PDA) or other handheld device. Generally, program modules may include routines, programs, objects, components, data structures, etc., and refer to code that performs particular tasks or implements particular abstract data types. The disclosure may be implemented in a variety of system configurations, including hand-held devices, consumer electronics, general-purpose computers, more specialty computing devices, etc. The disclosure may also be implemented in distributed computing environments where tasks are performed by remote-processing devices that are linked by a communication network.

With reference to FIG. 4, the computing device 400 may include a bus 410 that is directly or indirectly coupled to the following devices: one or more memories 412, one or more processors 414, one or more display components 416, one or more input/output (I/O) ports 418, one or more input/output components 420, and an illustrative power supply 422. The bus 410 may represent one or more kinds of busses (such as an address bus, data bus, or any combination thereof). Although the various blocks of FIG. 4 are shown with lines for the sake of clarity, and in reality, the boundaries of the various components are not specific. For example, the display component such as a display device may be considered an I/O component and the processor may include a memory.

The computing device 400 typically includes a variety of computer-readable media. The computer-readable media can be any available media that can be accessed by computing device 400 and includes both volatile and nonvolatile media, removable and non-removable media. By way of example, not limitation, computer-readable media may comprise computer storage media and communication media. The computer storage media may include volatile and nonvolatile, removable and non-removable media implemented in any method or technology for storage of information such as computer-readable instructions, data structures, program modules or other data. The computer storage media may include, but not limit to, random access memory (RAM), read-only memory (ROM), electrically-erasable programmable read-only memory (EEPROM), flash memory or other memory technology, compact disc read-only memory (CD-ROM), digital versatile disks (DVD) or other optical disk storage, magnetic cassettes, magnetic tape, magnetic disk storage or other magnetic storage devices, or any other medium which can be used to store the desired information and which can be accessed by the computing device 400. The computer storage media may not comprise signals per se.

The communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, but not limitation, communication media includes wired media such as a wired network or direct-wired connection, and wireless media such as acoustic, RF, infrared and other wireless media or any combination thereof.

The memory 412 may include computer-storage media in the form of volatile and/or nonvolatile memory. The memory may be removable, non-removable, or a combination thereof. Exemplary hardware devices include solid-state memory, hard drives, optical-disc drives, etc. The computing device 400 includes one or more processors that read data from various entities such as the memory 412 or the I/O components 420. The display component(s) 416 present data indications to a user or to another device. Exemplary presentation components include a display device, speaker, printing component, vibrating component, etc.

The I/O ports 418 allow the computing device 400 to be logically coupled to other devices including the I/O components 420, some of which may be embedded. Illustrative components include a microphone, joystick, game pad, satellite dish, scanner, printer, wireless device, etc. The I/O components 420 may provide a natural user interface (NUI) that processes gestures, voice, or other physiological inputs generated by a user. For example, inputs may be transmitted to an appropriate network element for further processing. A NUI may be implemented to realize speech recognition, touch and stylus recognition, facial recognition, biometric recognition, gesture recognition both on screen and adjacent to the screen, air gestures, head and eye tracking, touch recognition associated with displays on the computing device 400, or any combination thereof. The computing device 400 may be equipped with depth cameras, such as stereoscopic camera systems, infrared camera systems, RGB camera systems, or any combination thereof, to realize gesture detection and recognition. Furthermore, the computing device 400 may be equipped with accelerometers or gyroscopes that enable detection of motion. The output of the accelerometers or gyroscopes may be provided to the display of the computing device 400 to carry out immersive augmented reality or virtual reality.

Furthermore, the processor 414 in the computing device 400 can execute the program code in the memory 412 to perform the above-described actions and steps or other descriptions herein.

It should be understood that any specific order or hierarchy of steps in any disclosed process is an example of a sample approach. Based upon design preferences, it should be understood that the specific order or hierarchy of steps in the processes may be rearranged while remaining within the scope of the present disclosure. The accompanying method claims present elements of the various steps in a sample order, and are not meant to be limited to the specific order or hierarchy presented.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for aligning test environments, comprising:

measuring, by a measurement device located in an anechoic chamber, a standard signal transmitted from a base station simulator and went through to a channel emulator, then output with noise added inside the channel emulator, to multiple antennas within the anechoic chamber;

obtaining, by a computing device, measurement information based on the standard signal and the noise transmitted from the measurement device;

determining, by the computing device, whether the measurement information is within a predetermined range of a target value; and transmitting, by the computing device, a control signal to the channel emulator to adjust the noise output from the channel emulator so that the computing device obtains desired measurement information based on the standard signal and the adjusted noise when the measurement information is not within the predetermined range of the target value;

wherein the measurement information comprises a signal strength, and the signal strength is a total power of a full bandwidth signal.

2. The method as claimed in claim 1, wherein the particular reference signal is a downlink reference signal, a Synchronization Signal and PBCH block (SSB) signal, or a pilot reference signal.

3. The method as claimed in claim 1, wherein the predetermined range is plus or minus ten percent (±10%) of the target value.

4. The method as claimed in claim 1, wherein the measurement device is a spectrum analyzer or user equipment.

5. A system for aligning test environments, the system comprising:

a base station simulator;

a channel emulator, coupled to the base station simulator;

multiple antennas within an anechoic chamber, coupled to the channel emulator;

a measurement device, located in the anechoic chamber and measuring a standard signal transmitted from the base station simulator and went through to the channel emulator, then output with noise added inside the channel emulator, to multiple antennas within the anechoic chamber; and a computing device, coupled to the measurement device and the channel emulator, wherein:

the computing device obtains measurement information based on the standard signal and the noise transmitted from the measurement device;

the computing device determines whether the measurement information is within a predetermined range of a target value; and the computing device transmits a control signal to the channel emulator to adjust the noise output from the channel emulator so that the computing device obtains desired measurement information based on the standard signal and the adjusted noise when the measurement information is not within the predetermined range of the target value;

wherein the measurement information comprises a signal strength, and the signal strength is a total power of a full bandwidth signal.

6. The system as claimed in claim 5, wherein the particular reference signal is a downlink reference signal, a Synchronization Signal and PBCH block (SSB) signal, or a pilot reference signal.

7. The system as claimed in claim 5, wherein the predetermined range is plus or minus ten percent (±10%) of the target value.

8. The system as claimed in claim 5, wherein the measurement device is a spectrum analyzer or user equipment.

9. A method for aligning test environments, used in a computing device, wherein the method comprises:

receiving a standard signal and noise measured by a measurement device located in an anechoic chamber, wherein the standard signal is transmitted from a base station simulator and went through to a channel emulator, then output with the noise added inside the channel emulator, to multiple antennas within the anechoic chamber;

obtaining measurement information based on the standard signal and the noise;

determining whether the measurement information is within a predetermined range of a target value; and transmitting a control signal to a channel emulator to adjust the noise output from the channel emulator so that the computing device obtains desired measurement information based on the standard signal and the adjusted noise measured by the measurement device when the measurement information is not within the predetermined range of the target value;

wherein the measurement information comprises a signal strength, and the signal strength is a total power of a full bandwidth signal.

10. The method as claimed in claim 9, wherein the particular reference signal is a downlink reference signal, a Synchronization Signal and PBCH block (SSB) signal, or a pilot reference signal.

11. The method as claimed in claim 9, wherein the predetermined range is plus or minus ten percent (±10%) of the target value.

12. The method as claimed in claim 9, wherein the measurement device is a spectrum analyzer or user equipment.

* * * * *